United States Patent [19]

Stephens

[11] Patent Number: 4,999,574
[45] Date of Patent: Mar. 12, 1991

[54] SWITCHABLE AUTOMOTIVE CIRCUIT TEST LIGHT

[76] Inventor: Edward L. Stephens, 917 N. Oakland, St. Johns, Mich. 48879

[21] Appl. No.: 429,967

[22] Filed: Nov. 1, 1989

[51] Int. Cl.$^5$ .......................................... G01R 19/14
[52] U.S. Cl. .................................... 324/133; 324/556
[58] Field of Search ............... 324/133, 503, 433, 402, 324/556; 340/650, 652

[56] References Cited

U.S. PATENT DOCUMENTS

| | | | |
|---|---|---|---|
| 3,962,630 | 6/1976 | Chaffee | 324/51 |
| 4,028,621 | 1/1977 | Bloxam | 324/51 |
| 4,162,478 | 7/1979 | Huber et al. | 340/52 |
| 4,207,517 | 6/1980 | Bloxam | 324/51 |
| 4,210,862 | 7/1980 | Koslar | 324/133 |
| 4,366,434 | 4/1982 | Ellis | 324/51 |
| 4,540,940 | 9/1985 | Nolan | 324/133 |
| 4,599,557 | 7/1986 | Cestaro | 324/133 |
| 4,825,150 | 4/1989 | Sirasud | 324/133 |

Primary Examiner—Reinhard J. Eisenzopf
Assistant Examiner—Maura K. Regan

[57] ABSTRACT

A tool for automotive technicians to use to diagnose electrical problems on automobiles. That is easer to use, faster, and far more accurate. This tool comprises of a case to hold probe, circuit, LED's and a means to connect said tool to an automobile. Two lights, first light to tell the operator the tool is ready for use and that the electrical connections to the storage battery are complete to the second light. Second light illuminates when said probe is in contact with automobile system and continuity of said circuit exists. A switch on said tester to select current direction of said tester. Tester circuit which is lower thatn 20 milli amps. when in series or parallel with the automotive circuit being tested.

2 Claims, 1 Drawing Sheet

SWITCHABLE AUTOMOTIVE CIRCUIT TEST LIGHT

BACKGROUND

1. Field of the Invention

This invention relates to automotive test equipment, especially to circuit testing.

2. Description of Prior Art

A large number of voltage detectors and continuity checkers are known.

Heretofore, automotive test lights primarily consists of an alligator clip, a wire, a light, a probe and some sort of a case to house said light and probe.

Heretofore, automotive test lights do not notify the user of a malfunction in the unit (test light).

Using an alligator clip, has proven to be unsatisfactory to providing a good connection.

Using an alligator clip, the operator must change positions of the alligator clip (from positive to negative) to be able to check the opposite circuit.

Heretofore, automotive test lights have high current and should not be used on automobiles which have computer controlled circuits.

Heretofore, automotive test lights are hard to find a place to connect the alligator clip to.

OBJECTS AND ADVANTAGES

Accordingly I claim the following as my objects and advantages of the invention: to provide a tool for automotive technicians that is more accurate, easer and is faster to use.

This test light continuously monitors validity of the electrical leads and notifies the user if the test light is not functioning properly.

The use of a switch eliminates the operator having to change positions of the alligator clip and allows using one light emitting diode and informs user of automotive system being a positive or negative circuit.

The use of a lighter plug provides the operator one place to connect the test light to the automobile.

The test light has very low current and can be used on computer controlled circuits.

This test light can also be used on all domestic and foreign automobiles that are 12 volt negative ground.

DRAWING REFERENCE NUMERALS

Figure 1:
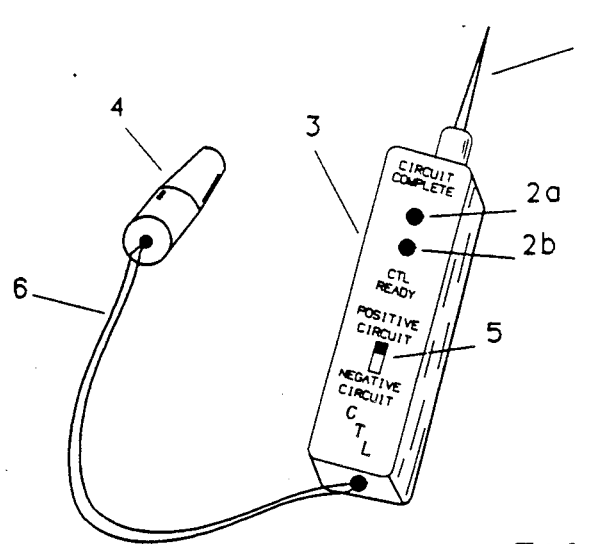
FIG. 1 Shows a top view of such tool.

1. Electrical conductive Probe
2. light Emitting Diode (LED)
3. Case
4. Lighter plug
5. Double Pole Double Throw Switch
6. Pair of electrical leads
7. 680 ohm Resistor
8. Probe connection
9. Negative connection
10. Positive connection
11. Through 22. Solder points on printed circuit
23. Printed circuit

DESCRIPTION

Figure 2:
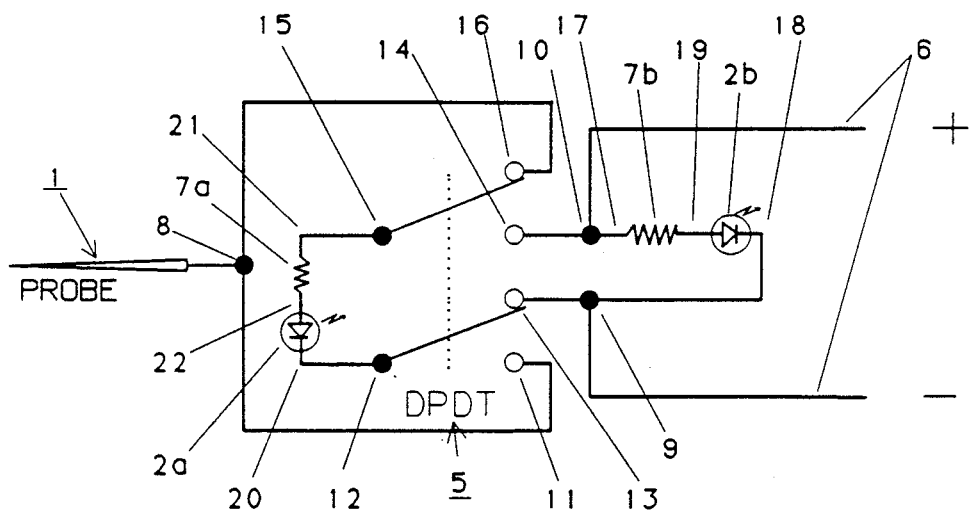
FIG. 2 Shows a wiring diagram of such tool.
Figure 3:
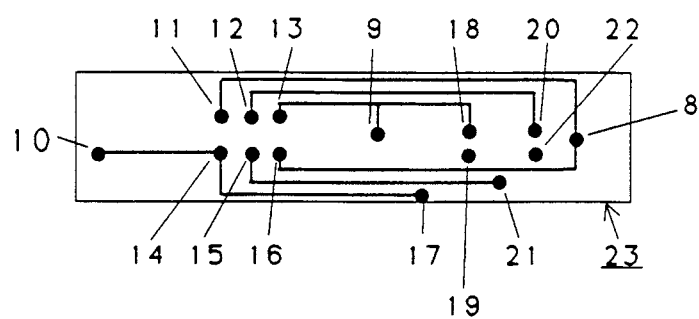
FIG. 3 Shows a printed circuit of such tool.

FIG. 1 shows a pair of electrical leads 6 connecting to the storage battery of the automative system being tested using a lighter plug 4 also into the case 3 to the printed circuit 23 shown in FIG. 3 at points 10 positive connection and 9 negative connection. The double pole double throw switch 5 shown in FIG. 2 is soldered on points 11, 12, 13, 14, 15, and 16 of the printed circuit 23 shown in FIG. 3. The anode (positive) leg of LED 2a is soldered to point 22 of the printed circuit 23 as shown in FIG. 3. The cathode (negative) leg of LED 2a is soldered to point 20 of the printed circuit 23 shown in FIG. 3. 680 ohm resistor 7a is soldered to point 22 on printed circuit 23 shown in FIG. 3 also 680 ohm resistor 7a is soldered to point 21 on printed circuit 23 shown in FIG. 3. The anode (positive) leg of LED 2b is soldered to point 19 of the printed circuit 23 as shown in FIG. 3. The cathode (negative) leg of LED 2b is soldered to point 18 of the printed circuit 23 shown in. FIG. 3. 680 ohm resistor 7b is soldered to point 19 on printed circuit 23 shown in FIG. 3 also 680 ohm resistor 7b is soldered to point 17 on printed circuit 23 shown in FIG. 3. The electrical conductive probe 1 shown in FIG. 1 is connected with a wire to point 8 on the printed circuit 23 shown in FIG. 3.

OPERATION

User connects the pair of electrical leads to the storage battery of the automotive system being tested by use of lighter plug 4 into the lighter socket of the automobile the battery positive of the automobile will then go to the electrical leads 6 shown in FIG. 1 to point 10 of the printed circuit 23 shown FIG. 3 to point 17 of the printed circuit 23 shown in FIG. 3 through 680 ohm resistor 7b shown in FIG. 2 to point 19 of printed circuit 23 shown in FIG. 3 to the anode (positive) leg of LED 2b shown in FIG. 1 to point 18 of printed circuit 23 shown in FIG. 3 to point 9 of printed circuit 23 shown in FIG. 3 and out the electrical leads 6 shown in FIG. 1 to Battery negative of the automobile lighting LED 2b shown in FIG. 1 notifying user the test light is ready to use. If the user chooses to check a positive circuit on the automobile the user selects the top position (position closes to LED 2b) of the double pole double through switch 5 and touches probe 1 to positive circuit on automobile which goes to point 8 of printed circuit 23 shown in FIG. 3 to point 16 of the double pole double through switch 5 shown in FIG. 2 to point 15 of the printed circuit 23 shown in FIG. 3 to point 21 of printed circuit 23 shown in FIG. 3 through 680 ohm resistor 7a to point 22 of printed circuit 23 shown in FIG. 3 through LED 2a to point 20 of printed circuit 23 shown in FIG. 3 to point 12 of printed circuit 23 shown in FIG. 3 through double pole double through switch 5 shown in FIG. 2 to point 13 of printed circuit 23 shown in FIG. 3 to point 9 of printed circuit 23 shown in FIG. 3 and to the electrical leads 6 to lighter plug 4 to automobile battery negative which lights LED 2a shown in FIG. 1. (with a 12 volt circuit and a 680 ohm resistor divide the volts 12 by the resistance of 680 ohm equals 0.0176 amps). If the user chooses to check a negative circuit on the automobile the user selects the bottom position (position closes to the bottom of case 3 shown in FIG. 1) of the double pole double through switch 5 and touches probe 1 to negative circuit on automobile which goes to point 8 of printed circuit 23 shown in FIG. 3 to point 11 of the double pole double through switch 5 shown in FIG. 2 to point 12 of the printed circuit 23 shown in FIG. 3 to point 20 of printed circuit 23 shown in FIG. 3 the cathode (negative) of LED 2a to point 22 of printed circuit 23 shown in FIG. 3 through 680 ohm resistor 7a to point 21 of printed circuit 23 shown in FIG. 3 to point 15 of printed circuit 23 shown in FIG. 3 through double pole double through switch 5 shown in FIG. 2 to point 14 of printed circuit 23 shown in FIG. 3 to point 10 of printed circuit 23 shown in FIG. 3 and to the electrical leads 6 to lighter plug 4 to automobile battery positive which lights LED 2a shown in FIG. 1.

CONCLUSION AND SCOPE

While the above description contains many specificities, the reader should not construe these as limitations on the scope of the invention, but merely as exemplifications of preferred embodiments thereof. Those skilled in the art will envision many other possible variations are within its scope. For example skilled artisans will readily be able to change the dimensions and shapes of the various embodiments. They will also be able to make the tool case of alternative materials. They can make many variations on the size of the resistors. They can change resistors value so the tool can be used on different voltage levels. They can install two alligator clips instead of the lighter plug. They can add a lighter socket with two alligator clips for the tool to plug into. Accordingly the reader is requested to determine the scope of the invention by the appended claims and their legal equivalents, and not by the examples which have been given.

I claim:

1. A portable hand held continuous self monitoring circuit tester, for detecting problems in automotive 12 volt electrical systems, computer controlled circuits comprising:

a case rectangular in shape, one end having an electrically conductive probe, the other end having first and second of electrical leads said first electrical lead connecting to the positive side of a storage battery of the automotive system being tested said second electrical lead connecting to the negative side of a storage battery of the automotive system being tested;

an upper portion of said case having first and second light emitting diodes, and a double pole double throw switch protruding through said case said first light emitting diode to continuously monitor said electrical leads said second light emitting diode used in testing the automotive system; first, second, and third electrical circuits enclosed in said case said first circuit comprising said first light emitting diode in series with a first current limiting resistor of approximately 680 ohms connected between said first and said second electrical leads said second circuit comprising said second light emitting diode in series with a second current limiting resistor of approximately 680 ohms connected between the electrical probe through the switch to said first electrical lead said third circuit comprising said second light emitting diode in series with said second current limiting resistor of approximately 680 ohms connected between the electrical probe through said switch to said second electrical lead;

said switch to change from said second to said third circuit.

2. The circuit tester of claim 1 wherein said electrical circuit has a less than 17 milliamps when in series or parallel with the automotive system being tested.

* * * * *